(12) United States Patent
Saucedo-Flores et al.

(10) Patent No.: US 7,339,203 B2
(45) Date of Patent: Mar. 4, 2008

(54) THYRISTOR AND METHOD OF MANUFACTURE

(75) Inventors: Emmanuel Saucedo-Flores, Jalisco CP (MX); David M. Culbertson, Tempe, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 90 days.

(21) Appl. No.: 11/317,340

(22) Filed: Dec. 22, 2005

(65) Prior Publication Data

US 2007/0145407 A1 Jun. 28, 2007

(51) Int. Cl.
*H01H 29/32* (2006.01)
*H01L 21/332* (2006.01)

(52) U.S. Cl. ............ 257/107; 257/115; 257/157; 257/E29.036; 257/E29.037; 438/48; 438/133

(58) Field of Classification Search ............ 257/107, 257/115, 157, E21.35, E21.388, E21.389, 257/E29.036, E29.037, E29.038, E29.046, 257/E29.047, E29.46, E29.48; 438/48, 133
See application file for complete search history.

(56) References Cited

U.S. PATENT DOCUMENTS

| 5,027,180 A * | 6/1991 | Nishizawa et al. ......... 257/266 |
| 5,281,832 A | 1/1994 | Clark et al. |
| 5,483,087 A | 1/1996 | Ajit |
| 5,610,434 A | 3/1997 | Brogle et al. |
| 5,629,535 A | 5/1997 | Ajit |
| 6,965,131 B2 | 11/2005 | Chang |

OTHER PUBLICATIONS

Fundamental Characteristics of Thyristors, Thyristor Product Catalog, AN1001-1 to -5. Copyrighted 2004. Retrieved from www.littelfuse.com.
Gating, Latching, and Holding of SCRs and Triacs Product Catalog, AN1002-1 to -5. Copyrighted 2004. Retrieved from www.littelfuse.com.

* cited by examiner

*Primary Examiner*—Long K. Tran
(74) *Attorney, Agent, or Firm*—Rennie William Dove

(57) ABSTRACT

A thyristor and a method for manufacturing the thyristor that includes a gate region extending from the first major surface into a semiconductor substrate and an anode region extending from the second major surface into the semiconductor substrate. A cathode region extends into a portion of the gate region. Optionally, enhanced doped regions extend into the gate and anode regions. A mesa structure having a height $H_G$ is formed from the first major surface and a mesa structure having a height $H_A$ is formed from the second major surface. The gate region extends under the first major surface of the semiconductor substrate and it extends vertically into the semiconductor substrate a distance that is greater than height $H_G$. The anode region extends under the second major surface of the semiconductor substrate and it extends vertically into the semiconductor substrate a distance that is greater than height $H_A$.

18 Claims, 3 Drawing Sheets

10

50

50

50

50

50

50

50

50

50

50

250

THYRISTOR AND METHOD OF MANUFACTURE

FIELD OF THE INVENTION

The present invention relates, in general, to semiconductor components and, more particularly, to thyristors.

BACKGROUND OF THE INVENTION

A thyristor is a semiconductor device used as a switch in power control applications. Typically, thyristors are comprised of multiple layers of P-type semiconductor material and N-type semiconductor material. Various types of thyristors include, among others, silicon controlled rectifiers (SCRs), triacs, sidacs, diacs, and transient surge protection devices. These devices differ from each other in the number of layers of P-type and N-type semiconductor material and in the number of terminals each has. For example, a silicon controlled rectifier (SCR) is a four layer semiconductor device that has three terminals, a triac is a five layer semiconductor device that has three terminals, a sidac is a five layer semiconductor device that has two terminals, and a diac is a three layer semiconductor device that has two terminals. As a further example, FIG. 1 is a cross-sectional view of a prior art SCR 10 that has a base region 12 of N-type conductivity sandwiched between gate and anode regions 14 and 16, respectively, of P-type conductivity. Gate region 14 is formed within a mesa structure 17 and anode region 16 is formed within a mesa structure 19. A cathode region 18 of N-type conductivity is formed within gate region 14. SCR 10 is configured such that an NPN transistor is formed from base region 12, gate region 14, and cathode region 18 and a PNP transistor is formed from anode region 16, base region 12, and gate region 14.

SCR 10 can be biased to operate in a forward operating mode or a reverse operating mode. In the forward operating mode, a positive voltage is applied to anode region 16 and a negative voltage is applied to cathode region 18. When a positive voltage is applied to gate region 14, the NPN transistor formed from base region 12, gate region 14, and cathode region 18 turns on which then turns on the PNP transistor formed from gate region 14, base region 12, and anode region 16.

In the absence of a bias voltage at gate region 14, the P-N junction between base region 12 and gate region 14 is reverse biased and a leakage current flows across the junction formed by gate region 14 and base region 12. The leakage current lowers the breakdown voltage of SCR 10, which decreases its reliability. In addition, the leakage current decreases the yield which increases the cost of manufacturing a thyristor such as, for example, SCR 10.

Hence, a need exists for a thyristor having a decreased reverse leakage current and improved reliability and a method of manufacturing the thyristor. Further, it would be advantageous for the thyristor to be cost efficient to manufacture.

BRIEF DESCRIPTION OF THE DRAWINGS

The present invention will be better understood from a reading of the following detailed description taken in conjunction with the accompanying drawing figures in which like reference characters designate like elements and in which.

DETAILED DESCRIPTION

Generally, the present invention provides a thyristor having a double-sided mesa structure. In accordance with one embodiment, the thyristor is fabricated from a semiconductor substrate having an upper mesa structure formed from a top side of the semiconductor substrate and a lower mesa structure formed from a bottom side of the semiconductor substrate. A gate region is formed from a mesa structure on the top side and an anode region is formed from the mesa structure on the bottom side. It should be understood that the terms "upper" and "lower" are used merely to facilitate distinguishing between the two mesa structures. The gate region extends laterally beyond the region of the upper mesa structure and into the portions of the semiconductor substrate adjacent the upper mesa structure. Similarly, the anode region extends laterally beyond the region of the lower mesa structure and into the portions of the semiconductor substrate adjacent the lower mesa structure. Alternatively, one of the gate region or the anode region extends laterally beyond the region of the upper mesa structure or lower mesa structure, respectively, into the portions of the semiconductor substrate adjacent the corresponding mesa structure. Thus, horizontal junctions are formed in the portions of the semiconductor substrate that are laterally adjacent to the mesa structures.

Figure 1:
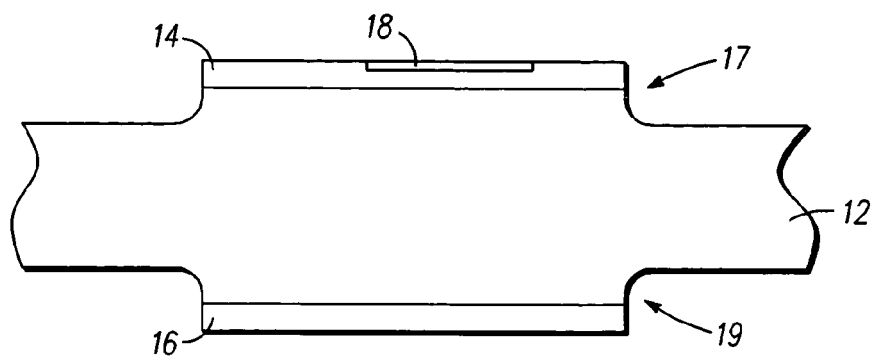
FIG. 1 is cross-sectional side view of a prior art thyristor.
Figure 2:
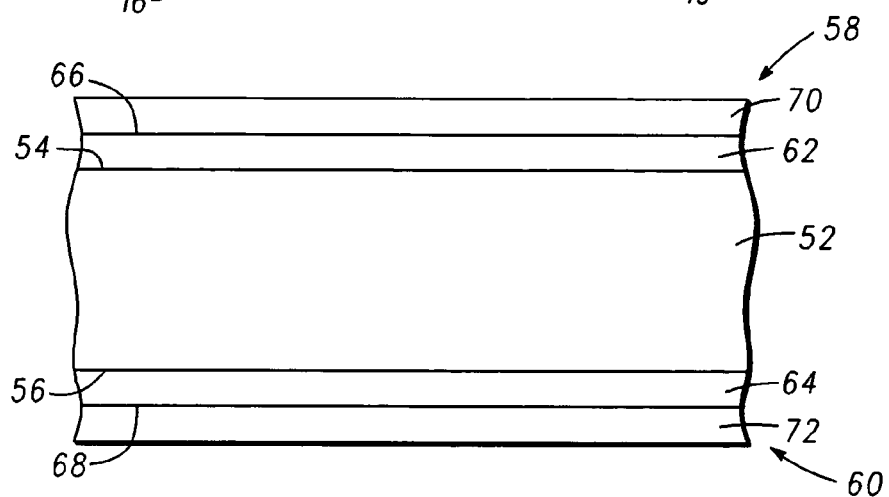
FIG. 2 is cross-sectional side view of a thyristor at an early stage of manufacture in accordance with an embodiment of the present invention.

FIG. 2 is a cross-sectional view of a thyristor 50 at an early stage of manufacture in accordance with an embodiment of the present invention. What is shown in FIG. 2 is a semiconductor substrate 52 having surfaces 54 and 56. Surface 54 is on side 58 of semiconductor substrate 52 and surface 56 is on side 60 of semiconductor substrate 52. Semiconductor substrate 52 has a thickness ranging from approximately 170 micrometers (7 mils) to approximately 350 micrometers (14 mils). Preferably, semiconductor substrate 52 has a thickness of approximately 270 micrometers (11 mils). In accordance with one embodiment, semiconductor substrate 52 is doped with an impurity material or dopant of N-type conductivity and has a dopant concentration ranging from approximately $5 \times 10^{13}$ atoms per cubic centimeter (atoms/cm$^3$) to approximately $3 \times 10^{14}$ atoms/ cm³. Suitable dopants of N-type conductivity include phosphorus and arsenic. It should be noted that the type of impurity material and the conductivity type of the impurity material of semiconductor substrate 52 is not a limitation of the present invention. Alternatively, semiconductor substrate 52 can be doped with an impurity material of P-type conductivity. It should be understood that when semiconductor substrate 52 is doped with an impurity material of P-type conductivity, the doped regions described hereinbelow would have the opposite conductivity type.

Dielectric layers 62 and 64 are formed on sides 58 and 60, respectively, of semiconductor substrate 52. Preferably, semiconductor substrate 52 is oxidized from sides 58 and 60 to form oxide layers 62 and 64 having surfaces 66 and 68, respectively. Although the oxidation of semiconductor substrate 52 consumes semiconductor substrate 52 at surfaces 54 and 56, the reference numbers for the surfaces of semiconductor substrate 52 are preserved for the sake of clarity. A layer of photoresist 70 is formed on surface 66 of oxide layer 62 and a layer of photoresist 72 is formed on surface 68 of dielectric layer 64 using techniques known to those skilled in the art.

Figure 3:
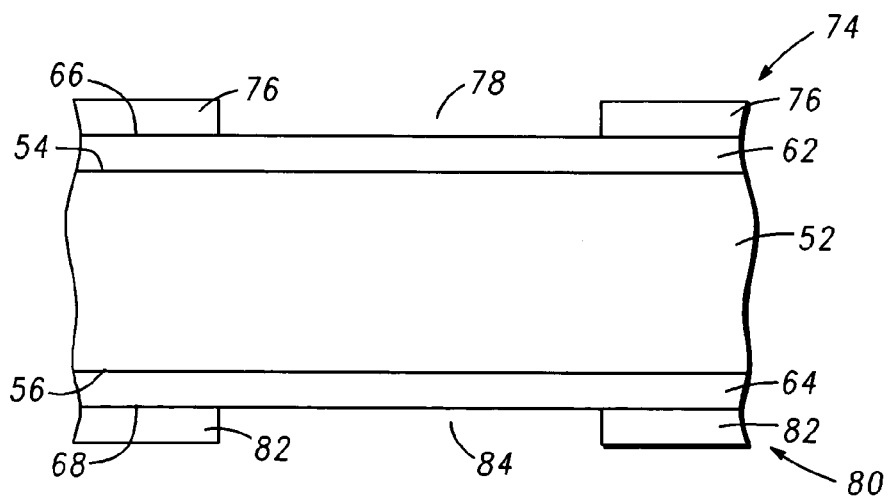
FIG. 3 is a cross-sectional side view of the thyristor of FIG. 2 at a later stage of manufacture.

Referring now to FIG. 3, photoresist layer 70 is patterned to form an etch mask 74 having masking features 76 and an opening 78 and photoresist layer 72 is patterned to form an etch mask 80 having masking features 82 and an opening 84. Opening 78 exposes a portion of dielectric layer 62 and opening 84 exposes a portion of dielectric layer 64.

Figure 4:
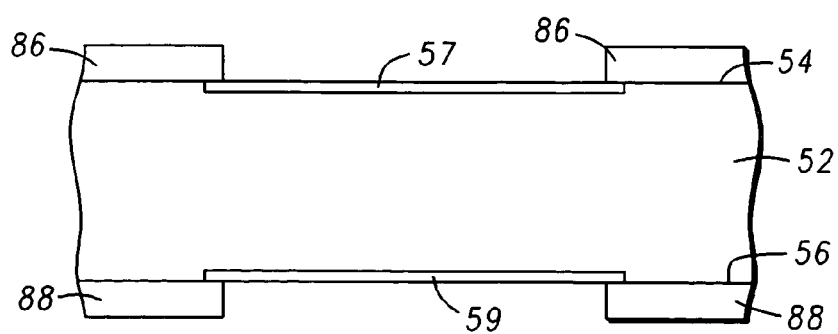
FIG. 4 is a cross-sectional side view of the thyristor of FIG. 3 at a later stage of manufacture.

Referring now to FIG. 4, the exposed portions of dielectric layers 62 and 64 are anisotropically etched using either a dry etch or a wet etch to expose portions of surfaces 54 and 56. By way of example, dielectric layers 62 and 64 are etched using hydrofluoric (HF) acid. Etch masks 74 and 80 are removed and the remaining portions 86 and 88 of dielectric layers 62 and 64, respectively, serve as doping masks.

An impurity material of P type conductivity is deposited on the exposed portions of surfaces 54 and 56 of semiconductor substrate 52 to form predeposition layers 57 and 59, respectively. By way of example, the impurity material is boron that is deposited to have a resistivity ranging from approximately 14 Ohms per square ($\Omega$/square) to approximately 400 $\Omega$/square. Suitable sources of boron include boron trichloride, diborane, or the like. The technique for disposing the boron on surfaces 54 and 56 is not a limitation of the present invention. It may be deposited, sprayed-on, spun-on, implanted using ion implantation, or the like.

Figure 5:
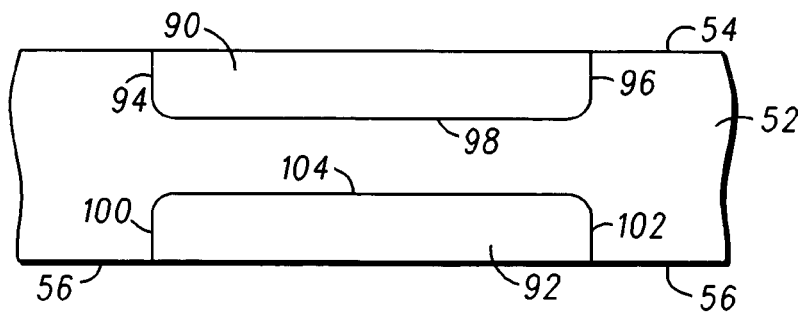
FIG. 5 is a cross-sectional side view of the thyristor of FIG. 4 at a later stage of manufacture.

Referring now to FIG. 5, the impurity material of predeposition layers 57 and 59 is driven into semiconductor substrate 52 to form doped regions 90 and 92. The drive-in is performed for a time ranging from approximately 20 hours to approximately 60 hours at a temperature ranging from approximately 1,250 degrees Celsius (° C.) to approximately 1,280° C. Doped region 90 extends from surface 14 into semiconductor substrate 52, has lateral boundaries 94 and 96, a vertical boundary 98, and serves as a gate region of thyristor 50. Doped region 92 extends from surface 56 into semiconductor substrate 52, has lateral boundaries 100 and 102, a vertical boundary 104, and serves as the anode region of thyristor 50. Etch masks 86 and 88 are removed from surfaces 54 and 56, respectively.

Figure 6:
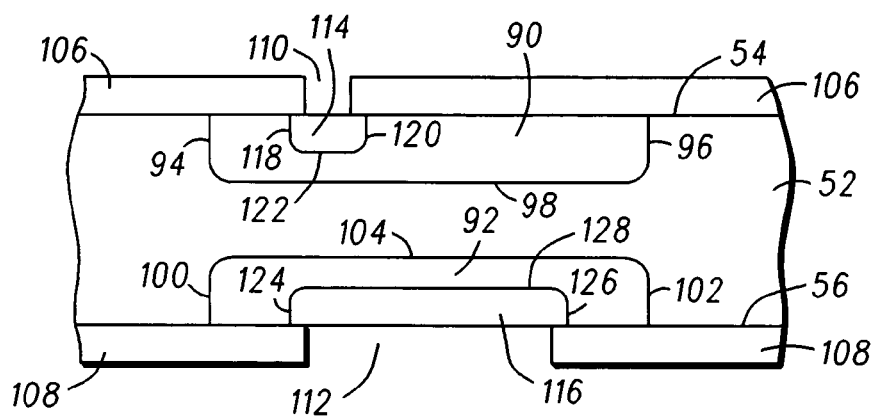
FIG. 6 is a cross-sectional side view of the thyristor of FIG. 5 at a later stage of manufacture.

Referring now to FIG. 6, layers of photoresist 106 and 108 are formed on surfaces 54 and 56 of semiconductor substrate 52, respectively. Layer of photoresist 106 is patterned to have an opening 110 that exposes a portion of gate region 90 and layer of photoresist 108 is patterned to have an opening 112 that exposes a portion of anode region 92. An impurity material of P-type conductivity is deposited on the exposed portions of surfaces 54 and 56 of gate region 90 and anode region 92, respectively. By way of example, the impurity material is boron and it is deposited to have a resistivity ranging from approximately 3.0 $\Omega$/square to approximately 30 $\Omega$/square. Suitable sources of boron include boron trichloride, diborane, or the like. The technique for disposing boron on surfaces 54 and 56 is not a limitation of the present invention. It may be deposited, sprayed-on, spun-on, implanted using ion implantation, or the like. The impurity material disposed on the exposed portions of gate region 90 and anode region 92 undergoes a drive-in to form enhanced doped regions 114 and 116, respectively. Layers of photoresist 106 and 108 are removed.

The drive-in is performed for a time ranging from approximately 8 hours to approximately 40 hours at a temperature ranging from approximately 1,200° C. to approximately 1,280° C. Enhanced doped region 114 extends from surface 54 into gate region 90, has lateral boundaries 118 and 120, a vertical boundary 122, and serves as a gate/anode contact region. Preferably, enhanced doped region 114 is adjacent to and spaced apart from lateral boundary 94 of gate region 90. More particularly, lateral boundary 118 of enhanced doped region 114 is spaced apart from lateral boundary 94 of gate region 90. Enhanced doped region 116 extends from surface 56 into anode region 92, has lateral boundaries 124 and 126, a vertical boundary 128, and serves as an anode contact region. Preferably, lateral boundary 124 is adjacent to and spaced apart from lateral boundary 100 of anode region 92, lateral boundary 126 is adjacent to and spaced apart from lateral boundary 102 of anode region 92, and vertical boundary 128 is within anode region 92.

Figure 7:
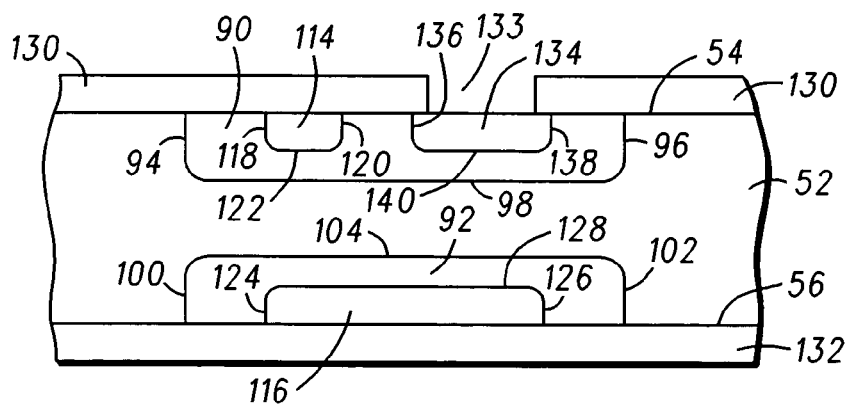
FIG. 7 is a cross-sectional side view of the thyristor of FIG. 6 at a later stage of manufacture.

Referring now to FIG. 7, layers of photoresist 130 and 132 are formed on surfaces 54 and 56 of semiconductor substrate 52, respectively. Layer of photoresist 130 is patterned to have an opening 133 that exposes a portion of gate region 90. An impurity material of N-type conductivity is deposited on the exposed portion of surface 54 of gate region 90. By way of example, the impurity material is phosphorus or a phosphorus containing material that is deposited to have a resistivity ranging from approximately 0.5 $\Omega$/square to approximately 2.5 $\Omega$/square. Suitable sources of phosphorus include phosphorus oxytrichloride ($POCl_3$), phosphine ($PH_3$), phosphorus pentaoxide, or the like. The phosphorus can be disposed on surface 54 by ion implantation. The impurity material disposed on the exposed portions of gate region 90 undergoes a drive-in to form a cathode region 134 having lateral boundaries 136 and 138 and a vertical boundary 140. Preferably, lateral boundary 136 is laterally spaced apart from lateral boundary 120 of enhanced doped region 114, lateral boundary 138 is laterally adjacent to and spaced apart from lateral boundary 96 of gate region 90, and vertical boundary 140 is within gate region 90. Layers of photoresist 130 and 132 are removed.

Figure 8:
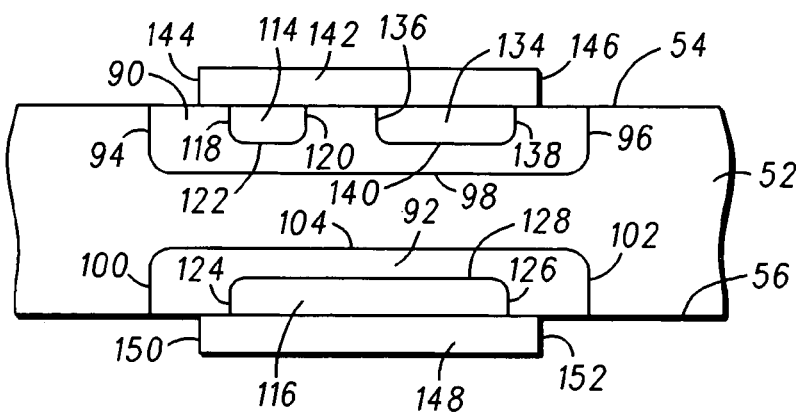
FIG. 8 is a cross-sectional side view of the thyristor of FIG. 7 at a later stage of manufacture.

Referring now to FIG. 8, an etch mask 142 having lateral boundaries 144 and 146 is formed on surface 54 and an etch mask 148 having lateral boundaries 150 and 152 is formed on surface 56. Etch masks 142 and 148 can be formed by patterning layers of photoresist on surfaces 54 and 56. Lateral boundary 144 of etch mask 142 is on the portion of surface 54 that is between lateral boundary 94 of gate region 90 and lateral boundary 118 of enhanced doped region 114, and lateral boundary 146 of etch mask 142 is on the portion of surface 54 that is between lateral boundary 96 of gate region 90 and lateral boundary 138 of cathode region 134. Lateral boundary 150 of etch mask 148 is on the portion of surface 56 that is between lateral boundary 100 of doped region 92 and lateral boundary 124 of enhanced doped region 116, and lateral boundary 152 of etch mask 148 is on the portion of surface 56 that is between lateral boundary 102 of doped region 92 and lateral boundary 126 of enhanced doped region 116. Etch mask 142 covers a portion of surface 54 and etch mask 148 covers a portion of surface 56. The portion of surface 54 under etch mask 142 is protected by etch mask 142 and the portion of surface 56 under etch mask 148 is protected by etch mask 148.

Figure 9:
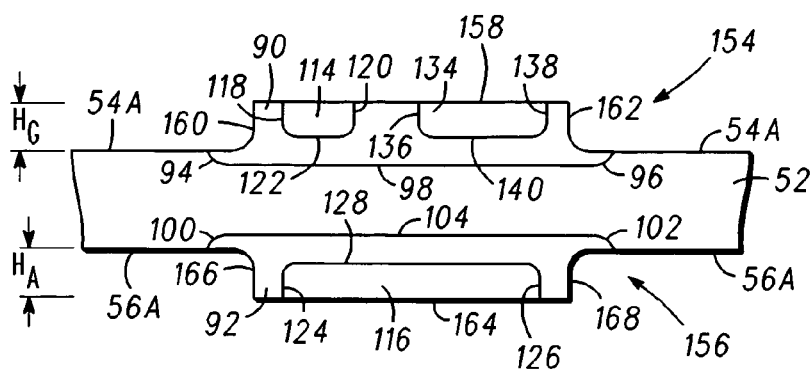
FIG. 9 is a cross-sectional side view of the thyristor of FIG. 8 at a later stage of manufacture.

Referring now to FIG. 9, the portions of surfaces 54 and 56 unprotected by etch masks 142 and 148, respectively, are etched to form mesa structures 154 and 156, respectively. The portions of surfaces 54 and 56 that are newly exposed are identified by reference characters 54A and 56A, respectively. Mesa structure 154 has a mesa surface 158, sidewalls 160 and 162, and a height $H_G$, and mesa structure 156 has a mesa surface 164, sidewalls 166 and 168, and a height $H_A$. It should be noted that mesa surface 158 is a portion of surface 54 and mesa surface 164 is a portion of surface 56. Height $H_G$ is the vertical distance from surface 54A to mesa surface 158 and height $H_A$ is the vertical distance from surface 56A to mesa surface 164. The distance that gate region 90 extends into semiconductor substrate 52 is greater than height $H_G$ and the distance that anode region 92 extends into semiconductor substrate 52 is greater than height $H_A$. By way of example, mesa structures 154 and 156 are formed using an isotropic wet etch. When mesa structures 154 and 156 are formed using an isotropic etch, sidewalls 160, 162, 166, and 168 have a concave shape. The method for forming mesa structures 154 and 156 is not limited to a wet etch or to an isotropic etch. An advantage of the present invention is that because lateral boundary 144 of etch mask 142 is between lateral boundary 94 of gate region 90 and lateral boundary 118 of enhanced doped region 114, and lateral boundary 146 of etch mask 142 is between lateral boundary 96 of gate region 90 and lateral boundary 138 of cathode region 134, portions of gate region 90 underlie surface 54. In other words, because the distance that gate region 90 extends into semiconductor substrate 52 is greater than height $H_G$, portions of gate region 90 extend under surface 54A. This creates a vertical junction, rather than a horizontal junction, between gate region 90 and semiconductor substrate 52. This configuration lowers the electric field intensity at the P-N junction formed between doped region 90 and base region 52 near lateral boundaries 94 and 96, thereby reducing the leakage current. Lowering the leakage current improves device performance, allows operation at higher temperatures, and allows the use of less stringent process conditions for wafer processing and assembly.

Likewise, because the lateral boundary 150 of etch mask 148 is between lateral boundary 100 of doped region 92 and lateral boundary 124 of enhanced doped region 116, and lateral boundary 152 is between lateral boundary 102 of doped region 92 and lateral boundary 126 of enhanced doped region 116, portions of anode region 92 underlie surface 56. In other words, because the distance that anode region 92 extends into substrate 52 is greater than height $H_A$, portions of anode region 92 extend under surface 56A. This creates a vertical junction, rather than a horizontal junction, between anode region 92 and semiconductor substrate 52. This configuration lowers the electric field intensity at the P-N junction formed between doped region 92 and base region 52 near lateral boundaries 100 and 102, thereby reducing the leakage current. Lowering the leakage current improves device performance, allows operation at higher temperatures, and allows the use of less stringent process conditions for wafer processing and assembly. It should be understood that in the portions of semiconductor substrate 52 adjacent mesa structures 154 and 156, the surface of semiconductor substrate 52 shifts. For the sake of clarity reference numbers 54 and 56 are preserved in identifying these portions of semiconductor substrate 52.

Figure 10:
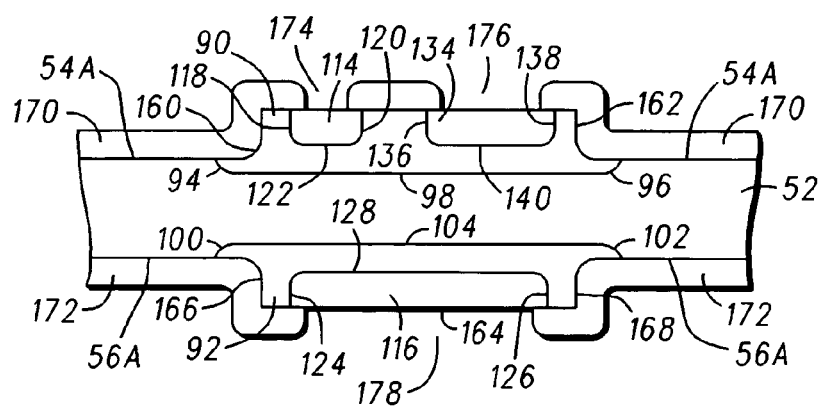
FIG. 10 is a cross-sectional side view of the thyristor of FIG. 9 at a later stage of manufacture.

Referring now to FIG. 10, a layer of photoglass 170 is formed on surface 54A and mesa structure 154 and a layer of photoglass 172 is formed on surface 56A and mesa structure 156. Photoglass layer 170 is patterned to have openings 174 and 176 which expose enhanced doped region 114 and cathode region 134, respectively, and photoglass layer 172 is patterned to have an opening 178 which exposes enhanced doped region 116. The method for forming openings 174, 176, and 178 is not a limitation of the present invention. For example, openings 174, 176, and 178 may be formed by disposing dielectric material such as, for example, silicon dioxide, on surfaces 54A and 56A and mesa structures 154 and 156, then disposing photoresist material on the dielectric material. The photoresist material is patterned to have openings which expose portions of the layers of dielectric material. The exposed portions of the layers of dielectric material are etched to form openings such as, for example, openings 174, 176, and 178.

Figure 11:
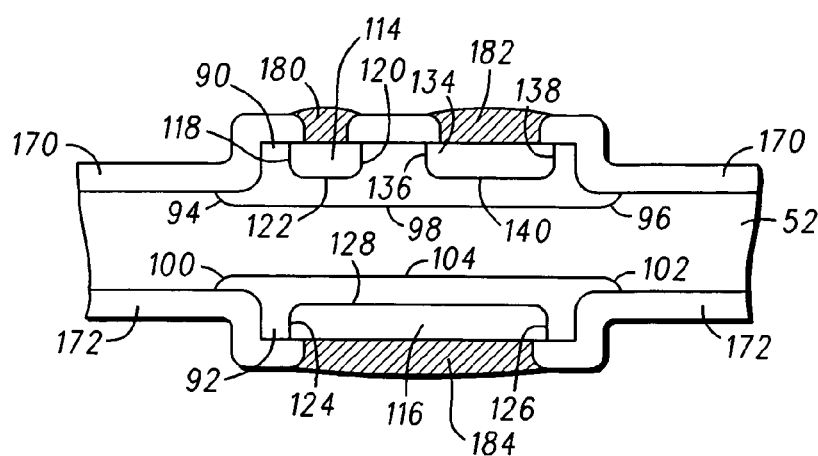
FIG. 11 is a cross-sectional side view of the thyristor of FIG. 10 at a later stage of manufacture.

Referring now to FIG. 11, a gate contact 180 is formed in opening 134 to contact enhanced doped region 114, a cathode contact 182 is formed in opening 176 to contact cathode region 134, and an anode contact 184 is formed in opening 178 to contact enhanced doped region 116.

Figure 12:
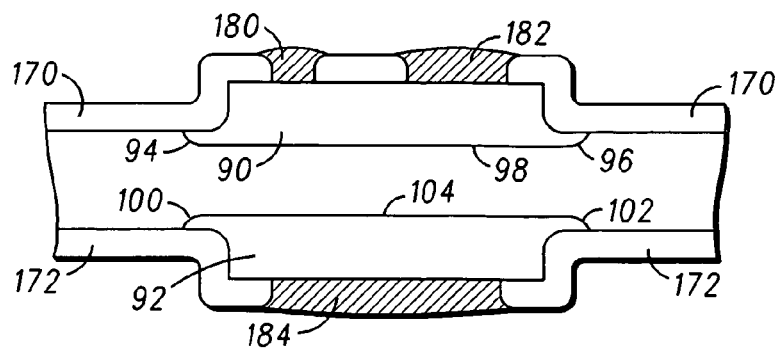
FIG. 12 is a cross-section side view of a thyristor in accordance with another embodiment of the present invention.

FIG. 12 is a cross-sectional side view of a bidirectional thyristor 250 in accordance with yet another embodiment of the present invention. Bidirectional thyristor 250 is similar to bidirectional thyristor 50 except that enhanced doped regions 114 and 116 are not included.

By now it should be appreciated that a thyristor and a method for manufacturing the thyristor have been provided. Preferably, the thyristor is a bidirectional semiconductor component and can be a triac, SCR, sidac, diac, transient surge protection device, or the like. In accordance with embodiments of the present invention, the dopant or impurity material of the gate and anode regions are driven deeper into the semiconductor substrate than the etch that forms the mesa structures. In accordance with one embodiment, both the gate and anode regions are driven deeper into the semiconductor substrate than the depth of the etch that forms the trench structures. In other words, the depth of the gate and anode regions is greater than the height of the mesa structures. An advantage of this configuration is that leakage current is reduced and the breakdown voltage is increased. In addition, this configuration allows the use of a thicker semiconductor substrate without sacrificing performance. In accordance with another embodiment, the depth of the gate region is greater than the height of the mesa structure and the depth of the anode region. In accordance with yet another embodiment the depth of the anode region is greater than the height of the mesa structure and the depth of the gate region.

Although certain preferred embodiments and methods have been disclosed herein, it will be apparent from the foregoing disclosure to those skilled in the art that variations and modifications of such embodiments and methods may be made without departing from the spirit and scope of the invention. For example, the conductivity type of the semiconductor substrate can be P-type conductivity, the conductivity type of the gate and anode regions can be N-type conductivity, and the conductivity type of the cathode region can be P-type conductivity. It is intended that the invention shall be limited only to the extent required by the appended claims and the rules and principles of applicable law.

What is claimed is:

1. A thyristor, comprising:
a semiconductor substrate of a second conductivity type having first and second sides;
a first mesa structure extending from the first side, the first mesa structure having a mesa surface and first and second sidewalls, the first sidewall of the first mesa structure extending from a first portion of the first side to the mesa surface of the first mesa structure and the second sidewall of the first mesa structure extending from a second portion of the first side to the mesa surface of the first mesa structure;
a second mesa structure extending from the second side, the second mesa structure having a mesa surface and first and second sidewalls, the first sidewall of the second mesa structure extending from a first portion of the second side to the mesa surface of the second mesa structure and the second sidewall of the second mesa structure extending from a second portion of the second side to the mesa surface of the second mesa structure;
a first doped region of a first conductivity type in the first mesa structure, wherein the first doped region has a first boundary laterally spaced apart from the first sidewall and a second boundary laterally spaced apart from the second sidewall, wherein the first doped region laterally extends beyond the first mesa structure and extends to the mesa surface of the first mesa structure; and
a second doped region of a first conductivity type in the second mesa structure, wherein the second doped region has a first boundary laterally spaced apart from the first sidewall and a second boundary laterally spaced apart from the second sidewall, wherein the first doped region laterally extends beyond the first mesa structure and extends to the mesa surface of the second mesa structure.

2. The thyristor of claim 1, wherein the first and second sidewalls of the first mesa structure and the first and second sidewalls of the second mesa structure have a concave shape.

3. The thyristor of claim 1, wherein the first doped region extends from the mesa surface of the first mesa structure into the semiconductor substrate a distance that is greater than a height of the first mesa structure.

4. The thyristor of claim 1, further including a third doped region within the first doped region.

5. The thyristor of claim 4, wherein the first and second doped regions are of a first conductivity type and the third doped region is of a second conductivity type.

6. The thyristor of claim 5, wherein the first conductivity type is P-type conductivity and the second conductivity type is N-type conductivity.

7. The thyristor of claim 4, further including an enhanced doped region of the first conductivity type within the second doped region.

8. The thyristor of claim 1, further including a first dielectric material disposed over the first sidewall of the first mesa structure, a portion of the mesa surface of the first mesa structure, and a subportion of the first portion of the first side.

9. The method of claim 8, further including a second dielectric material disposed over the first sidewall of the second mesa structure, a portion of the mesa surface of the second mesa structure, and a subportion of the first portion of the second side.

10. The thyristor of claim 1, further including first, second, and third contacts, the first contact in contact with the first doped region, the second contact in contact with the second doped region, and the third contact in contact with the third doped region.

11. A thyristor, comprising:
a semiconductor substrate having first and second sides;
a first mesa structure extending from a first portion of the first side, the first mesa structure having a mesa surface and first and second sidewalls, the first sidewall of the first mesa structure extending from the first portion of the first side to the mesa surface of the first mesa structure and the second sidewall of the first mesa structure extending from the second portion of the first side to the mesa surface of the first mesa structure;
a second mesa structure extending from the second side, the second mesa structure having a mesa surface and first and second sidewalls, the first sidewall of the second mesa structure extending from a first portion of the second side to the mesa surface of the second mesa structure and the second sidewall of the second mesa structure extending from a second portion of the second side to the mesa surface of the second mesa structure;
a first doped region in the first mesa structure, wherein the first doped region has a first subportion that extends from the first portion of the first side to the mesa surface of the first mesa structure and a second subportion that extends from the second portion of the first side to the mesa surface of the first mesa structure;
a third doped region within the first doped region, wherein the first and second doped regions are of a first conductivity type and the third doped region is of a second conductivity type;
a first enhanced doped region of the first conductivity type within the first doped region, wherein the first enhanced doped region is spaced apart from the third doped region; and
a second doped region in the second mesa structure, wherein the second doped region has a first subportion that extends from the first portion of the second side to the mesa surface of the second mesa structure and a second subportion that extends from the second portion of the second side to the mesa surface of the second mesa structure.

12. The thyristor of claim 11, further including a second enhanced doped region of the first conductivity type within the second doped region.

13. A bidirectional semiconductor component, comprising:
a semiconductor substrate having first and second surfaces;
a first mesa structure extending from the first surface, the first mesa structure having a mesa surface, a sidewall, and a height;
a gate region within the first mesa structure, the gate region extending from the first surface to the mesa surface of the first mesa structure a distance that is greater than the height of the first mesa structure;
a second mesa structure extending from the second surface, the second mesa structure having a mesa surface, a sidewall, and a height;
an anode region within the second mesa structure, the anode region extending from the second surface to the mesa surface of the second mesa structure a distance that is greater than the height of the second mesa structure; and
a cathode region within the gate region.

14. The bidirectional semiconductor component of claim 13, wherein the sidewall of the first mesa structure and the sidewall of the second mesa structure are concave.

15. The bidirectional semiconductor component of claim 13, further including an enhanced doped region disposed in the gate region, the enhanced doped region disposed in the gate region being of the same conductivity type as the gate region.

16. The bidirectional semiconductor component of claim 15, further including an enhanced doped region disposed in the anode region, the enhanced doped region disposed in the anode region being of the same conductivity type as the anode region.

17. The bidirectional semiconductor component of claim 13, wherein the gate region has P-type conductivity, the cathode region has N-type conductivity, and the anode region has P-type conductivity.

18. The bidirectional semiconductor component of claim 13, wherein the gate region extends under the first surface and the anode region extends under the second surface.

* * * * *